United States Patent [19]
Lemelson

[11] Patent Number: 5,871,805
[45] Date of Patent: Feb. 16, 1999

[54] COMPUTER CONTROLLED VAPOR DEPOSITION PROCESSES

[76] Inventor: Jerome Lemelson, 868 Tyner Way, Incline Village, Nev. 89450

[21] Appl. No.: 628,088

[22] Filed: Apr. 8, 1996

[51] Int. Cl.$^6$ .................................................. C23C 16/52
[52] U.S. Cl. .................................. 427/8; 427/9; 427/10; 427/248.1; 427/255.5; 427/585; 427/596
[58] Field of Search .......................... 427/8, 9, 10, 248.1, 427/249, 255.5, 585; 118/596, 665, 713, 697, 698, 715

[56] References Cited

U.S. PATENT DOCUMENTS

| | | | |
|---|---|---|---|
| Re. 33,876 | 4/1992 | Goward et al. | 428/633 |
| 2,411,867 | 12/1946 | Brenner | 51/309 |
| 2,793,282 | 5/1957 | Steigerwald | 219/69 |
| 2,861,166 | 11/1958 | Cargill, Jr. | 219/34 |
| 2,947,610 | 8/1960 | Hall et al. | 23/209.1 |
| 2,968,723 | 1/1961 | Steigerwald | 250/49.5 |
| 3,141,746 | 7/1964 | Delai | 51/307 |
| 3,207,582 | 9/1965 | Inoue | 23/209.1 |
| 3,346,458 | 10/1967 | Schmidt | 176/1 |
| 3,702,573 | 11/1972 | Nemeth | 76/101 A |
| 3,714,332 | 1/1973 | Rasquin | 423/446 |
| 3,913,280 | 10/1975 | Hall | 51/307 |
| 3,916,506 | 11/1975 | Wolf | 428/457 |
| 3,929,432 | 12/1975 | Caveney | 51/295 |
| 3,959,557 | 5/1976 | Berry | 428/368 |
| 4,054,426 | 10/1977 | White | 51/309 R |
| 4,084,942 | 4/1978 | Villalobos | 51/307 |
| 4,321,311 | 3/1982 | Strangman | 428/623 |
| 4,326,011 | 4/1982 | Goebel et al. | 428/641 |
| 4,371,570 | 2/1983 | Goebel et al. | 427/248.1 |
| 4,385,880 | 5/1983 | Lemelson | 425/77 |
| 4,401,097 | 8/1983 | Simonds et al. | 124/23 R |
| 4,405,659 | 9/1983 | Strangman | 427/248.1 |
| 4,405,660 | 9/1983 | Ulion et al. | 427/248.1 |
| 4,434,188 | 2/1984 | Kamo et al. | 427/39 |
| 4,490,229 | 12/1984 | Mirtich et al. | 204/192 C |
| 4,504,519 | 3/1985 | Zelez | 427/39 |
| 4,554,208 | 11/1985 | Maciver et al. | 428/332 |
| 4,594,294 | 6/1986 | Eichen et al. | 428/552 |
| 4,627,989 | 12/1986 | Feuerstein et al. | 427/10 |
| 4,663,183 | 5/1987 | Ovshinsky et al. | 427/39 |

(List continued on next page.)

FOREIGN PATENT DOCUMENTS

| | | |
|---|---|---|
| 57-106513 | 12/1980 | Japan . |
| 60-195094 | 3/1984 | Japan . |
| 61-106494 | 10/1984 | Japan . |
| 61-124573 | 11/1984 | Japan . |
| 62-72921 | 9/1985 | Japan . |
| 62-196371 | 2/1986 | Japan . |

OTHER PUBLICATIONS

W. Lee Smith, et al. "Film Thickness Measurements for Chemical Mechanical Planarization", Solid State Technology, Jan. '96, pp. 77–86.

J. Narayan, et al. "Laser Method for Synthesis and Processing of Continuous Diamond Films on Non–Diamond Substrates" Science, vol. 252 (no date).

Angus, John C. et al. Low–Pressure, Metastable Growth of Diamond and 'Diamondlike' Phases, Science, vol. 241, 19 Aug. '88, pp. 913–921.

Bourdon, et al. "Growth Mechanisms of Diamond–Like Films Formed by Laser Ablation of Graphite", Applied Surface Science, Aug. 20, 1990.

Collins, et al. "The Bonding of Protective Films of Amorphic Diamond to Titanium", Journal of Applied Physics, Dec. 16, 1991, vol. 71, No. 7.

*Primary Examiner*—Shrive Beck
*Assistant Examiner*—Timothy Meeks
*Attorney, Agent, or Firm*—Niro, Scavone, Haller & Niro

[57] ABSTRACT

A method for computerized control of vapor deposition processes, including chemical vapor deposition and electron beam physical vapor deposition processes, uses optical imaging sensors and/or laser interferometers or infrared ellipsometers focused on the substrate being coated or on a nearby test blank to provide information which is computer analyzed to yield optimum control points for the coating process. A method is also disclosed for shaping or contouring one or more surfaces of an object(s) using the techniques disclosed here.

40 Claims, 3 Drawing Sheets

U.S. PATENT DOCUMENTS

| | | | |
|---|---|---|---|
| 4,707,384 | 11/1987 | Schachner et al. | 427/249 |
| 4,725,345 | 2/1988 | Sakamoto et al. | 204/192.31 |
| 4,734,339 | 3/1988 | Schachner et al. | 428/701 |
| 4,764,434 | 8/1988 | Aronson et al. | 428/565 |
| 4,816,286 | 3/1989 | Hirose | 427/39 |
| 4,849,199 | 7/1989 | Pinneo | 423/446 |
| 4,859,493 | 8/1989 | Lemelson | 427/45.1 |
| 4,874,596 | 10/1989 | Lemelson | 423/446 |
| 4,882,138 | 11/1989 | Pinneo | 423/446 |
| 4,904,542 | 2/1990 | Mroczkowski | 428/620 |
| 4,957,526 | 9/1990 | Frazee, Jr. et al. | 65/3.11 |
| 4,960,643 | 10/1990 | Lemelson | 428/408 |
| 4,974,498 | 12/1990 | Lemelson | 92/223 |
| 5,009,485 | 4/1991 | Hall | 350/163 |
| 5,015,502 | 5/1991 | Strangman et al. | 427/248.1 |
| 5,021,628 | 6/1991 | Lemelson | 219/121.6 |
| 5,040,501 | 8/1991 | Lemelson | 123/188 AA |
| 5,067,826 | 11/1991 | Lemelson | 384/492 |
| 5,087,477 | 2/1992 | Giggins, Jr. et al. | 427/38 |
| 5,096,352 | 3/1992 | Lemelson | 411/424 |
| 5,119,760 | 6/1992 | McMillan et al. | 48/722 |
| 5,131,941 | 7/1992 | Lemelson | 75/10.19 |
| 5,132,587 | 7/1992 | Lemelson | 313/141 |
| 5,190,823 | 3/1993 | Anthony et al. | 428/408 |
| 5,224,969 | 7/1993 | Chen et al. | 51/295 |
| 5,284,394 | 2/1994 | Zarnoch et al. | 384/463 |
| 5,346,719 | 9/1994 | Zarnoch et al. | 427/97 |
| 5,366,556 | 11/1994 | Prince et al. | 118/722 |
| 5,382,293 | 1/1995 | Kawarada et al. | 118/723 DC |
| 5,391,407 | 2/1995 | Dearnaley | 427/527 |
| 5,391,409 | 2/1995 | Shibata et al. | 427/577 |
| 5,403,399 | 4/1995 | Kurihara et al. | 118/723 DC |
| 5,403,433 | 4/1995 | Morrison et al. | 156/626 |
| 5,413,941 | 5/1995 | Koos et al. | 437/8 |
| 5,418,003 | 5/1995 | Bruce et al. | 427/126.2 |
| 5,472,505 | 12/1995 | Lee et al. | 118/715 |
| 5,485,271 | 1/1996 | Drevillon et al. | 356/345 |
| 5,494,697 | 2/1996 | Blayo et al. | 427/10 |
| 5,552,327 | 9/1996 | Bachmann et al. | 437/8 |

COMPUTER CONTROLLED VAPOR DEPOSITION PROCESSES

FIELD OF THE INVENTION

This invention relates to the adaptive computer control of chemical vapor deposition (CVD) processes and physical vapor deposition (PVD) processes (such as electron beam physical vapor deposition, EBPVD), using real-time thickness monitoring and 3D geometric modeling combined with thermochemical modeling of the coating process, to optimize coating performance.

BACKGROUND OF THE INVENTION

CVD processes are used to modify the surface properties of substrates by depositing one or more layers of a metal or refractory or metallic compound through chemical reactions occurring in a gaseous medium surrounding the substrate. Physical vapor deposition processes such as EBPVD also modify the surface properties of substrates, but typically no chemical reaction occurs at the substrate or in the gas phase; the mechanism is one of condensation of the coating constituents from the vapor phase onto the substrate to form the coating rather than chemical reaction of gas phase precursor materials.

In chemical vapor deposition (CVD) processing, a substrate or part is heated to an elevated temperature (usually greater than 800° C. and frequently as high as 2000° C.) and exposed to a mixture of reactant gases. The reactant gases are selected to include compounds of the specific atomic species desired in the finished coating. (Metal halides and hydrides are commonly-used reactants.) Chemical reactions occur at the surface of the substrate to yield the desired coating composition. Pyrolysis, reduction, oxidation, hydrolysis and coreduction are among the types of reactions that have been utilized commercially:

TYPICAL CHEMICAL REACTIONS IN CVD PROCESSING

| Reaction | Equation |
| --- | --- |
| Thermal decomposition, pyrolysis | $CH_3SiCl_3 \longrightarrow SiC + 3HCl$ |
| Reduction | $WF_6 + 3H^2 \longrightarrow W + 6HF$ |
| Oxidation | $SiH_4 + O_2 \longrightarrow SiO_2 + 2H_2$ |
| Hydrolysis | $2AlCl_3 + 3H_2O \longrightarrow Al_2O_3 + 6HCl$ |
| Coreduction | $TiCl_4 + 2BCl_3 + 5H_2 \longrightarrow TiB_2 + 10HCl$ |

The use of organometallic compounds as precursors enables operation at lower temperatures, in the 800° C. range. In such operations, as disclosed in U.S. Pat. No. 5,119,760 (McMillan, et al.), the organic base (typically xylene or alcohol) contains a micropowder of the coating composition (metal or otherwise). In the vapor deposition chamber the organic base is dissociated from the coating composition, but little or no chemical reaction of the coating composition occurs; it is already at the desired stoichiometric composition.

In addition to the oxidants and reducing and hydrolyzing gases shown above, inert carrier gases such as $N_2$, He and/or Ar are sometimes employed. And, in some instances the surface of the substrate alloy or metal itself may participate in the CVD reactions, as in the reaction of the surface of a nickel or nickel alloy substrate with $AlCl_3$ and $H_2$ to form a nickel aluminide film.

In conventional CVD operations, the substrate is placed inside a reaction chamber and heated to reaction temperature by any of a variety of techniques, including radiant heat from Kanthal, Globar (SiC) or graphite heating elements; convection heating from reactant and/or carrier gas; direct electrical heating by passing a current through the substrate itself; electrical induction heating of the substrate; RF heating of the substrate and combinations thereof. Reactant gases may be heated by laser light, by infrared radiation if the particular gases have adequate adsorptivity, or by radiation at other than infrared wavelengths such as microwave radiation. In addition, reactants may be supplied wholly or partly in plasma form, as in plasma-assisted chemical vapor deposition (PACVD). PACVD techniques are used for applying films of synthetic diamond and/or diamond-like carbon to substrates. Laser-assisted CVD reactors also can be used for that purpose.

Both cold-wall and hot-wall CVD processes are in use. Cold-wall processes limit extraneous deposition of coating material on the walls of the reaction chamber, since the walls are maintained at temperatures below those required for CVD reactions. But substrate temperature distribution is less even in cold-wall processes, leading to less-uniform coatings.

In addition to planar coatings, CVD processes also can be used to apply coatings to pre-formed porous fiber beds via chemical vapor infiltration (CVI). SiC coatings may be applied to fibrous carbon substrate materials in this way.

CVD techniques also can be used to grow "whiskers" of refractory material, such as single crystal TiC formed by reduction of Ti halide gas with $H_2$ and $CH_4$. The addition of such crystals to ceramics reduces brittleness and improves fracture toughness.

CVD techniques can be used to provide extremely hard and durable coatings of synthetic diamond or diamond-like materials on a wide variety of substrates. Such processes generally use thermal decomposition of a mixture of hydrogen and carbon compounds, preferably hydrocarbons, into diamond-generating carbon atoms, preferentially from the gas phase, activated in such a way as to substantially avoid the deposition of graphitic carbon. The specific types of carbon compounds useful for CVD include C1–C4 saturated hydrocarbons such as methane, ethane, propane and butane; C1–C4 unsaturated hydrocarbons such as acetylene, ethylene, propylene and butylene; gases containing C and O such as carbon monoxide and carbon dioxide; aromatic compounds such as benzene, toluene, xylene, and the like; and organic compounds containing C, H, and at least one of oxygen and/or nitrogen such as methanol, ethanol, propanol, dimethyl ether, diethyl ether, methylamine, ethylamine, acetone, and similar materials (see U.S. Pat. No. 4,816,286). The molar concentration of carbon compounds in the hydrogen gas can vary from about 0.1% to about 5%, preferably from about 0.2% to 3%, and more preferably from about 0.5% to 2%. The resulting diamond film in such a deposition method is in the form of adherent individual crystallites or layer-like agglomerates of crystallites substantially free from intercrystalline adhesion binder.

Such CVD processes are known to those skilled in the art, and ordinarily use some form of energy (for example, microwave radiation, as in U.S. Pat. No. 4,859,493 and in U.S. Pat. No. 4,434,188) to pyrolyze hydrocarbon gases such as methane at concentrations of about 1% to 2% in a low pressure (about 10 torr) hydrogen atmosphere, causing deposition of diamond or "diamond-like carbon" (a-C) or "diamond-like hydrocarbon" (a-C:H) particles or film on a nearby substrate. (Diamond and "diamond-like carbon" (a-C) coatings have an atomic hydrogen fraction of zero; for "diamond-like hydrocarbon" (a-C:H) coatings that fraction ranges from about 0.15 to about 0.6. Diamond coatings have atom number densities around 0.29 gram-atoms per cubic centimeter; "diamond-like carbon" (a-C) and "diamond-like hydrocarbon" (a-C:H) materials are characterized by atom number densities above 0.19 gram-atoms per cc.) It is also known to assist the CVD process using a variety of techniques including (1) pyrolysis by a hot tungsten filament intended to generate atomic hydrogen near the substrate (HFCVD); (2) supplying electrons by negatively biasing the filament as in electron-assisted chemical vapor deposition (EACVD); (3) creating a plasma using microwave energy or RF energy (PACVD; see U.S. Pat. Nos. 4,504,519 and 5,382,293); (4) using an argon ion beam to decompose the hydrocarbon feedstock, as in U.S. Pat. No. 4,490,229 and (5) using direct-current electrical discharge methods. See, generally, John C. Angus and Cliff C. Hayman, "Low-Pressure, Metastable Growth of Diamond and 'Diamond-like' Phases," *Science*, Aug. 19, 1988, at p. 913.

Synthetic diamond-coated articles have found a wide variety of uses. U.S. Pat. No. 4,960,643, for example, discloses articles coated with synthetic diamond particles of controlled size, to which an overlying film, for example of chromium, has been applied to lubricate the diamond layer and to help resist scratching and wear. Other patents disclose various diamond-coated articles of manufacture, including bearings (U.S. Pat. No. 5,284,394); fasteners (U.S. Pat. No. 5,096,352); engine parts (U.S. Pat. Nos. 5,132,587 and 4,974,498) and the like.

The usefulness of diamond-coated engineered materials, and especially those made by CVD techniques, has been limited, however, by the large residual stress which remains in the finished composite products after coating is complete and the coated article has cooled. The stress arises from the very large differences in coefficients of thermal expansion (CTE) between the diamond coating (which have very low CTE's) and the substrates to which it is desired to bond it (often a metal or ceramic having a much higher CTE). The substrate contracts during cooling more than the diamond film, leaving the diamond film in a permanent state of compressive stress which promotes spalling and cracking. The effect is aggravated by the high elastic modulus (low compressibility) of diamond compared to that of the substrate.

In co-pending application Ser. No. 08/477,532, filed Jun. 7, 1995, now U.S. Pat. No. 5,688,557, the disclosure of which is incorporated herein by reference, I and my co-inventor (in that application) disclose improved diamond-coated articles and methods of manufacture which utilized engineered intermediate bonding layers to alleviate the undesirable stress effects caused by the mismatch in thermal expansion coefficients between typical substrates and diamond coatings.

In a typical physical vapor deposition operation, the article to be coated is held over a molten pool of material of appropriate composition which evaporates, and the vapor condenses on and coats the article. This process is used in a variety of applications including the application of metallic coatings to gas turbine engine parts. In a common embodiment of the physical vapor deposition process, an ingot of refractory such as yttria-stabilized zirconia (YSZ) is placed in a vacuum chamber below the part to be coated and an electron beam is focused on the YSZ material, vaporizing it. The YSZ condenses on the part, which is held above the ingot. The rate of deposition and the quality of coating achieved are functions of pressure; gaseous atmosphere; positioning and/or rotation of the part being coated; electron beam focus and intensity; temperature and other operating parameters. In some applications a metal alloy bond coat may be applied to the substrate before EBPVD application of the refractory coating in order to improve adhesion. See, for example, U.S. Pat. No. 4,321,311 (Strangman). EBPVD is useful for producing columnar refractory ceramic coatings, in which the ceramic forms a columnar microstructure with individual, microscopic columns having cross-sections on the order of 0.1 mils firmly bonded to the substrate but not to each other. Such coating structures, which resemble the piles of a carpet, can resist spalling caused by flexure of the substrate as well as thermal stress induced by thermal expansion coefficient mismatch between the substrate and the refractory ceramic. (One disadvantage of such coatings, however, is that the ceramic is permeable to gas, which can directly reach the substrate or the bond coat through the microscopic gaps between the individual microscopic columns.)

Control of EBPVD processes shares some of the difficulties presented by CVD processes. As in the case of CVD processes, the challenge is to produce a coating that embodies the best compromise in terms of properties among a number of goals such as resistance to cracking and spalling and effective performance as a thermal barrier.

To date both CVD processes and EBPVD processes have been subject either to manual control or to rudimentary feedback control limited to little more than maintaining steady state temperatures and reactant flowrates during deposition or, at most, to imposing a predetermined time-reactor temperature profile during the deposition process, as in U.S. Pat. No. 5,119,760 (McMillan et al.). Those control strategies have proved inadequate either for minimizing residual stress mismatches or for providing coatings having adequate uniformity and smoothness.

SUMMARY OF THE INVENTION

My invention provides methods and apparatus for using electro-optical or radiation imaging techniques to optimize the operation of CVD and PVD coaters during the coating operation itself. More specifically, one or more visible, infrared and/or laser light based or other radiation-based imaging systems are used to scan the substrate being coated (or an appropriate test blank that is simultaneously exposed to the same conditions as the substrate) and to measure critical coating parameters, which may include coating thickness, surface roughness, reflectivity and the like. A real-time computer model of the deposition process is then used to process the measurements, generating an objective function tailored to the specific process goals. (One such objective function could be the von Mises stress in a diamond layer, for example.) Feedback signals are generated and used to adjust key operating conditions of the coating process, which may include temperature, pressure, reactant flowrates and composition and the like.

Accordingly, it is an object of this invention to provide improved CVD and EBPVD coatings having properties that can be controlled and adjusted during the deposition process itself.

It is a further object of this invention to provide means for controlling the profile of coatings produced by EBPVD and/or CVD operations.

It is still another object of this invention to provide means for simultaneously and adaptively controlling all pertinent process parameters of EBPVD and/or CVD coaters in order to optimize one or more desired characteristics of the coatings produced.

It is a further object of this invention to provide a computer-controlled system capable of precise, automatic control of one or more predetermined coating properties.

DETAILED DESCRIPTION OF THE PREFERRED EMBODIMENTS—CVD

Figure 1:
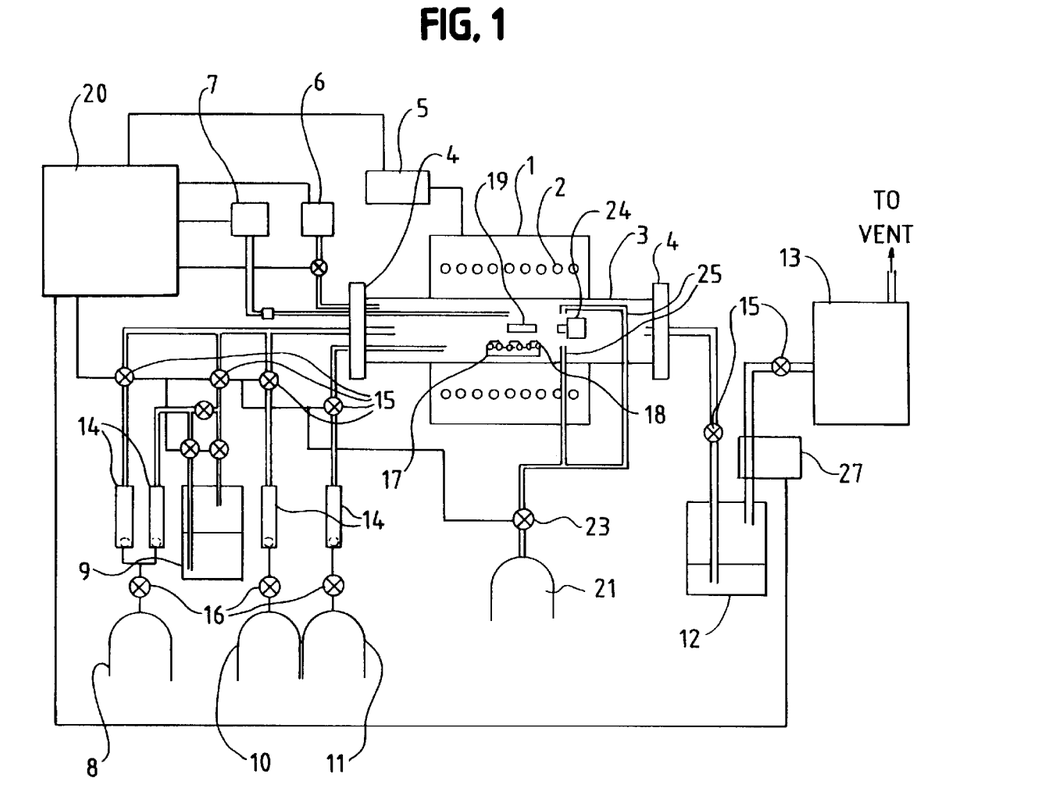
FIG. 1 illustrates a CVD apparatus to which the control system of my invention has been applied.

FIG. 1 illustrates a CVD apparatus according to my invention in which an imaging system employing visible light is used to observe coating thickness on a test blank, providing a control point which is compared with a predetermined, desired thickness profile to generate an objective function that is used to adaptively control the CVD process. The test blank 19, preferably made of the same material as the substrate 17 which is to be coated with a diamond or other CVD coating, is positioned in the reactor 1 at a position in which it is subject to the same conditions as the substrate. Reactor temperature is continuously monitored by a plurality of appropriately positioned thermocouples, thermistors or other temperature measuring devices 8, which are positioned so as to record temperatures surrounding the substrate and the test blank. Alternatively or in addition, pyrometric devices 22 may be used to measure the temperature of the substrate surface itself. In still another possible arrangement, the test blank is outfitted with internal thermocouples or thermistors so as to provide one or more temperature profiles across the thickness of the blank and/or along its surface. In that instance the test blank is most desirably made of the same material as the substrate being coated (or at least made of a material having substantially the same thermal diffusivity) and has the same overall shape, thus providing an accurate simulation of the temperature profile within the part being coated itself.

To coat a substrate, the substrate 17 and the test blank 19 are first positioned with the reaction chamber 3. The chamber is heated to the desired temperature using power controller 5 and heating elements 2 or other heating means, whereupon the computer 20 actuates valves 15 to start predetermined flows of desired reactant gases such as $H_2$ and $CH_4$. One or more optical sensors 24 may be positioned so as to view an edge of the test sample 19, enabling coating thickness to be monitored. Both the optics of the sensor and the edge of the test blank are protected from reactant gases (and thus, from being covered by the coating that is being applied to the substrate) by means of an inert gas purge (helium, nitrogen or argon, for example) delivered from source 21 through nozzles 25 from valve 23, also under computer control. In addition, the sensor optics may be cooled by purge gas or other means to reduce their temperature below the level at which chemical reactions leading to coating deposition occur.

In one embodiment of my invention, the part, substrate or test blank is scanned at a fixed rate using a vibrating piezoelectric transducer to move the imaging device. The coating thickness is determined from the scanning frequency at which the scanning device can traverse the entire coating thickness.

In another embodiment, visible fluorescence from the coating, at varying wavelength, is sensed to form the image. A sensor situated outside the reaction chamber may be used.

In still another embodiment, laser interferometry is used to measure the coating thickness on the test blank, the workpiece or both according to some variation of the following procedure. Laser light of known, predetermined wavelength is directed toward the surface of the test blank or workpiece at an angle of at least 60° to 70° away from a line perpendicular to the surface. It is known that the amount of internal refraction and resulting absorption of the light reflecting off the substrate from the upper surface of the coating and back to the substrate is maximized when the thickness of the coating is approximately equal to an integer multiple of the wavelength of the incident laser light. Laser light can be utilized, therefore, to monitor diamond coating thickness as a function of time, as the coating is applied: maximum absorption will occur as the coating thickness reaches the first integer multiple of the laser light wavelength, with successive absorption maxima at coating thicknesses equal to subsequent integer multiples of the wavelength. Differing wavelengths of light can be used to add flexibility, although problems have arisen in the past as a result of lack of knowledge of which integer multiple of the wavelength corresponds to a specific absorption maximum. The surface of the workpiece or test blank may be periodically scanned to yield a contour plot of coating thickness, which can be compared with a predetermined specification using computer control apparatus. A specific apparatus and method for laser interferometry is explained in U.S. Pat. No. 5,413,941 (Koos, et al.), the disclosure of which is incorporated herein by reference. The transparency of diamond coatings facilitates use of this method.

One advantage of embodiments of my invention that make use of laser interferometric thickness measurements in conjunction with visible light TV microscopy monitoring of coating thickness is that the uncertainty about what integer multiple of thickness is being observed is eliminated. The TV-visible light observation makes a rough determination, sufficient to establish the approximate thickness for purposes of identifying an integer multiple with a specific absorption maximum. Fine tuning to a precise thickness can then be accomplished by scanning laser interferometry across the surface of the workpiece or test blank to provide optimum flatness or another profile. For example, if a profile of varying thickness is desired, the laser light absorption measurements at various points on the surface provide a direct measurement of thickness which can be compared with the desired profile during the coating operation and especially as the desired thickness is approached.

In yet another embodiment of my invention, infrared ellipsometry may be used to determine coating thickness by measuring the changes in polarization state of the light reflected from the coating surface, as described in U.S. Pat. No. 5,485,271 (Drevillon, et al.), the disclosure of which is incorporated by reference herein. As with laser interferometry, combination of infrared ellipsometry with visual-light observation of the workpiece or, preferably, the edge of a nearby test blank facilitates control because it allows direct visual observation of rapid coating growth until close to the point where the desired thickness has been achieved, at which time the coating application rate can be reduced and the control algorithm may be switched to measurements based on infrared ellipsometry or laser interferometry to complete the coating application process with knowledge that the results of those measurement techniques are being properly interpreted based on the correct integer multiple of the coating thickness.

In still another embodiment, continuously-cleaned fiber optics are used to convey a microscopic visible light image from the vicinity of the part or blank to a remotely-located TV sensor.

As an alternative or in addition to one or more optical sensors, other surface measurement techniques may be used. For example, magnetic resonance imaging (MRI) of the coating and substrate, and other sensing techniques known in the art may be employed. The sensing devices may be oriented in various ways with respect to the coating on the blank. Thus, one or more light or other radiation sources may be placed so as to impinge on the coated surface at a shallow angle and one or more optical sensors can be used to detect the angle of reflection, thus measuring the change in thickness of the coating.

In another embodiment of the invention, the sensing device focuses directly on the working substrate being coated rather than (or in addition to) focusing on the blank. This may provide a more direct observation of desired coating properties.

Further features of a CVD apparatus of my invention are as follows. The reactor itself features water-cooled end flanges 4 at the ends of reaction chamber 3. The working substrate is shown at 17 with coating 18. Pressure and temperature sensors 6 and 7 are used to monitor reactor conditions. Reactant gases (which may include the reactants listed above, as well as others known to those skilled in the art) are fed from reservoirs 8, 10 and 11 or other feed system means, through pressure regulators 16, flow meters 14 and control valves 15. Where liquid-phase reactants are used (for example, in low-temperature CVD using organometallic precursors in alcohol or xylene solution) a vaporizer 9 may be employed. Downstream of the reactor a particulate trap 12 and gas scrubber 13 are used to recover unreacted feed materials.

Figure 2:
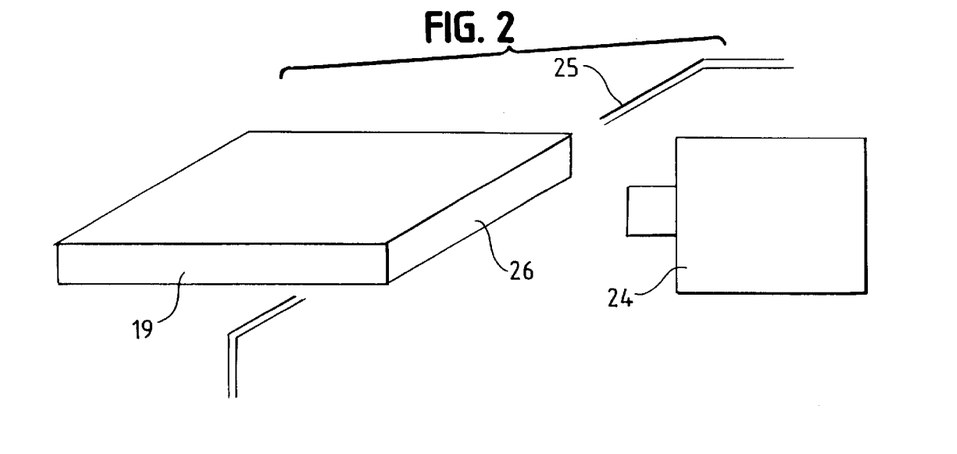
FIG. 2 shows an optical imaging system which is directed at a test blank situated within a CVD reactor, used to control the CVD operation.

FIG. 2 illustrates a blank 19 having one face 26 protected from deposition by means of purge gas nozzles 25, thus enabling observation of the thickness of the coating by means of optical sensing device 24. In CVD operation, cold reactant gas may be used as a purge gas.

During coater operation, the computer is used as follows to optimize coating properties. A predetermined mathematical model of the coating process which takes account of the effect of pertinent process variables on a selected group of coating properties is used as a basis for calculations. The process variables may include reactant gas flowrates, reactor and substrate temperature profiles and heat input rates. In addition, for such CVD processes as PACVD, microwave power and wavelength may be adjusted. In a LACVD process, the wavelength, path and intensity of coherent light or radiation may be adjusted. The timing and duration of laser pulses also may be computer-controlled. For EACVD processes, the temperature, voltage, etc. of the electron source is also computer-controllable. In any event, a predetermined mathematical model relates the predicted effects of changes in those process parameters on one or more objective functions. The objective functions may include average coating thickness; von Mises stress; coating surface finish; patterns of coating deposition or non-deposition, among other possibilities.

Suitable mathematical models can be written from models of the kinetics of the coating reactions such as those listed above, suitably adjusted for mass transfer/diffusion limitations and combined with radiation/convection/conduction heat transfer equations and enthalpy balances to predict temperatures and kinetics at the coating surface. Alternatively or additionally, a multivariable linearized mathematical model may be created by establishing steady state operation near a set of conditions thought to be moderately suitable, and then perturbing the controlled variables (temperatures, flowrates, etc.) one at a time by a small amount away from the initial condition while measuring the effect on the controlled variables used as inputs for the objective function (thickness, stress, growth rate, etc.). The resulting plurality of transfer functions can be used in a linearized model to predict behavior in a region near the initial steady state operating conditions. Such a model lacks the theoretical underpinnings of a model based on chemistry and heat and mass transfer, but may be superior in terms of accounting for unpredictable artifacts of particular reactor setups. The usable ranges of stochastic models of the latter sort can be broadened by utilizing non-linear transfer functions, where appropriate. (For example, Arhennius-type rate expressions with statistically determined coefficients advantageously can be used to model temperature effects on reaction rates.)

In addition to mathematical models of the deposition process reflecting the thermochemical behavior of the process, in preferred embodiments of my invention I also take into account the desired geometry of the part being coated. This allows the coating process to be dynamically adjusted to produce an optimum coating profile. More specifically, a four-component geometric model may be predetermined, including a functional CAD analyzer for CASE/CIM, a 3D graphical reconstructor and visualization processes, uniform communication protocols using ISO 10303 STEP format, and a real-time, closed-loop monitoring process control algorithm, which may be of the objective-function type described in further detail below.

During process operation, the output of the optical or other sensing devices 24 is preferably digitized and then compared with a predetermined image of the coating desired, generating an error signal representing the deviation of the actual coating thickness or shape from the desired thickness or shape.

The goal of designing a functional CAD analyzer for CAE/CIM is to anticipate actual physical phenomena (laser sintering, electron beam welding, etc.) of materials for planning slices in layered manufacturing so that the thicknesses of slices can be dynamically adjusted/optimized and different paths can be planned for different materials with the same geometry. The goal of designing a 3D graphical model is to provide the capability of reconstructing the planned solid free-form fabrication (SFF) layers and displaying the process for visualization purposes. The goal of designing a closed-loop control model is to provide a real-time process control for accommodating the proposed changes in material composition, layer by layer.

Figure 3:
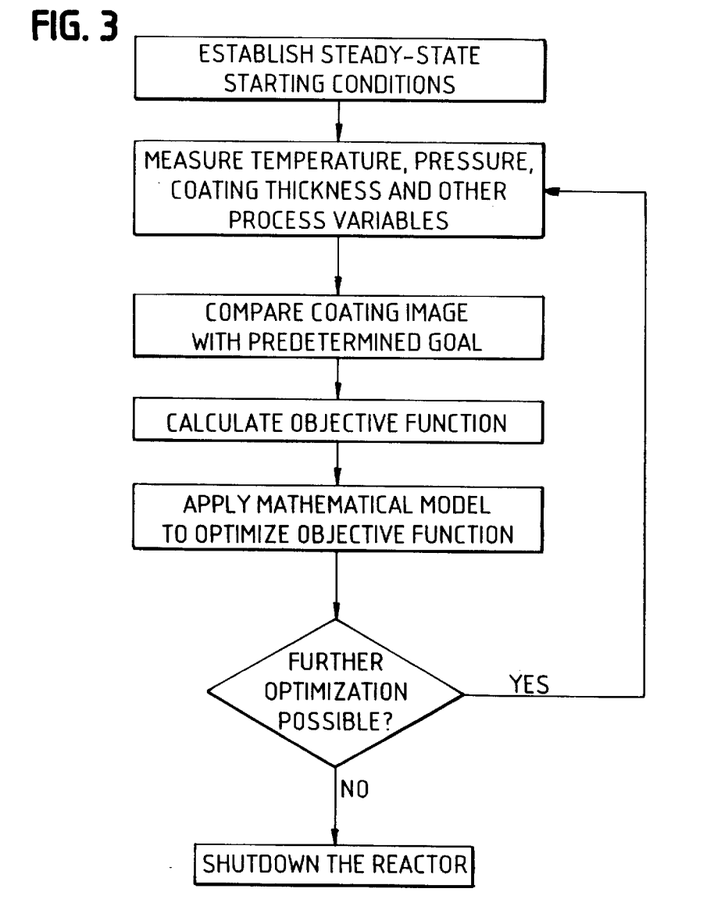
FIG. 3 is a block diagram of one form of imaging system for use in the invention.

The flow diagram of this embodiment of my invention is shown in FIG. 3. As a part is designed with a geometric CAD model, the functional CAD analyzer will analyze the desired part in light of the mathematical model reflecting the expected thermochemical behavior of the substrate and coating materials and, accordingly, the SFF slice generator will generate the geometrical data for each layer. To minimize the manufacturing errors, a 3D shape comparator will estimate the accuracy of the reconstructed part from the generated layers by comparing to the desired part. If the error is within the design tolerances, the build path for various SFF system paths will be adjusted for the geometry of the generated slice. This information will then be put into STEP format for production. To meet various formats for different SFF systems, a SFF format convertor will be designed to accept a STEP format. To monitor the material composition layer by layer of the actual part manufactured, a monitor system will scan the actual geometry of each layer. The proposed 3D reconstructor and shape comparator will reconstruct the partial actual part and compare the desired generated part. If there are errors due to material composition, the geometry of SFF layers will be real-time adjusted for the SFF system.

The physical behavior of materials within each slice will be determined from databases. Complex behavior of systems of materials will be determined from constitutive relationships that will help to anticipate the behavior of the composite as it is being constructed in the fast free-form fabrication machine.

By including descriptions of physical phenomena of material composition to each pixel on conventional 2D computer models of slices of parts, the 2D slices become 3D ones with various thicknesses to accommodate changes in material composition. This dynamic control of thickness, taking into account the characteristics of different materials, cannot be handled by traditional, prior art CAD models and control algorithms. Another advantage of the functional CAD model of my invention is that with the same geometry, different laser paths or electron beam control/part positioning strategies can be planned for different materials to accommodate the material composition for better manufacturing accuracy.

The 3D slices used in my invention may be reconstructed either from the functional CAD 2D slices or from monitored slices and are used to compare with the original geometric CAD model. To do it, a shape comparator is used. Inconsistencies found in the set-up phase will be corrected and adjusted before the slices get sent to production. Any discrepancy between the CAD model and the reconstructed manufactured part will be analyzed and compensated on-line through the closed-loop process, as shown in FIG. 3.

To enhance the 3D visualization from 2D images use is made of more efficient algorithms to accomplish this task. As the pixels that form the contour on each slice can be thought of as points in 2D space, the contour construction may be considered as a polygonal curve approximation problem. Approximation schemes for polygonal curve fitting are employed. Triangulation algorithms based on various criteria and clustering techniques are applied. After the contours have been constructed for each slice, 3D reconstruction is accomplished by using the convex hull algorithm in 3D space, given planar polygons in two distinct planes. Once the polyhedron representing the 3D images in the form of wireframe or constructive solid geometry (CSG) is computed with its surface composed of triangular patches, surface or volume rendering schemes to aid the visualization will then be applied. To indicate the real-time process visually on a display, a simulator for different layered manufacturing process is used. The simulator accepts the real-time monitoring data and reconstructs the manufactured parts.

One or more time-averaging techniques based on successive images obtained over time may be employed to yield coating growth rates, in addition to instantaneous coating profiles. The error signals resulting from the 3D comparison process described above are utilized, together with measurements of other process parameters (temperatures, reactant flowrates and the like) as inputs to the mathematical model of the coating process. Numerical values of one or more objective functions are then calculated. Next, one or more of a variety of optimization algorithms known to those skilled in the art is used by the computer to predict values of the objective function(s) that would result from step changes by predetermined amounts in the controlled variables. The computer model then selects the best of the group of predicted outcomes from among the series of changes surveyed ("best" in the sense of, e.g., minimizing or maximizing one or more objective functions chosen beforehand based on the goal of the operation). The control points for the controlled variables are then adjusted to reflect the values predicted for the best outcome, and the process of measurement, prediction and correction is repeated. This adaptive control process continues until the predetermined coating specifications have been met, or until the mathematical model indicates that further improvement in the objective function is not possible.

While FIG. 3 simply illustrates a generalized block flow diagram of one embodiment of a computer control system of this invention, using the 3D comparator described above and applied to a CVD process, it will be appreciated that other logical sequences are possible and may be preferred in a given system.

Figure 4:
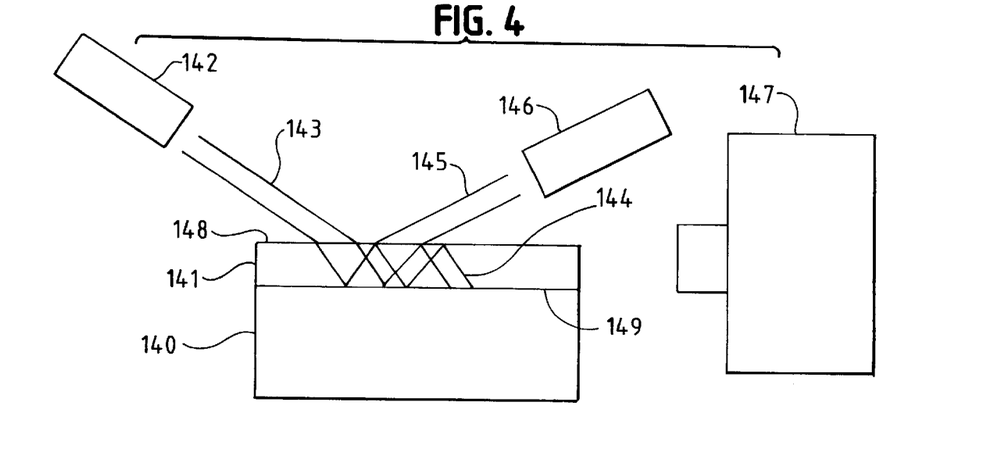
FIG. 4 shows an optical imaging system using laser interferometry, directed at a substrate situated within a CVD reactor, used to control the CVD operation.

Referring now to FIG. 4, there is shown a laser light source 142 which focuses laser light 143 at an acute angle into the coating 141 being formed on substrate 140. (Either the workpiece or a test blank can be used for this technique.) Impinging upon the surface 148 of the coating, the laser light is refracted and reflected off the surface 149 of the substrate 140. Depending upon the coating thickness, a greater or lesser amount of laser light is reflected back and forth within the coating 141, with some laser light 145 escaping the coating to be detected by sensor 146. As explained above, the absorption reaches a maximum at integral values of the laser light wavelength. Also shown in FIG. 4 is an electro-optical TV receiver 147, which displays an image of the edge of the workpiece or test blank to provide a measurable approximate thickness of the coating 141.

Operation of this embodiment of my invention is similar to that of the embodiment of FIGS. 2 and 3, with an added feature. During the initial phase of coating application, coating thickness is measured exclusively by computerized image analysis of the video signals output by the TV receiver 147. But a specific predetermined laser light wavelength has been pre-selected for use, such that some integral multiple of that wavelength matches the desired coating thickness. When the coating thickness approaches the desired level, but before that level is actually reached, the coating thickness measurement used by the control algorithm and computer model described above is switched from the computer analysis of the TV receiver output to the computer analysis of the thickness measured by the laser interferometer. At that point it may also be desirable to reduce the rate of coating application (for example, by adjusting the operating temperature or reactant feed rates or both). Final approach to the desired coating thickness is then made more slowly, based on precise measurements from the laser interferometer which can be compared with predetermined target coating thickness contours. In this manner the overall speed of the coating operation is increased, while maintaining close control of thickness during the final stage of the application process. (Those of ordinary skill will appreciate that infrared ellipsometry or other techniques can be substituted for laser interferometry while maintaining that overall processing concept.)

Another example of a surface measurement technique that can find advantageous use with the present invention is the use of terrahertz radiation or ("T-rays"), defined as electromagnetic pulses of radiation in the range of one trillion cycles per second. (Discussions of applications for T-rays using time-domain spectroscopy and other techniques are found in the July/August 1995 issue of *Biophotonics International* (pages 58–59) and the December, 1995 issue of *R&D magazine* (pages 19–20).) The T-rays, generated and directed as a single beam or a plurality of beams, penetrate and reflect from or pass through matter and are modulated when selected frequencies are absorbed and/or dispersed due to variations in the material(s) to which the rays are exposed. In the method employing a single beam, T-rays are generated at a single frequency, or generated at a number of select frequencies, simultaneously or sequentially, within a given range of frequencies. The T-ray beam is deflection-controlled or otherwise caused to scan along a given path, such as a raster scanning path across select matter such as a supported stationary object (e.g., a substrate or blank), a selected portion of an object (e.g., a deposited layer on a substrate), or a liquid or gas in motion. The matter scanned may also be controllably moved with the respect to the T-ray beam(s) during a test or diagnostic procedure. A computer is used to control the scanning operation in a closed and/or open loop control method and, in addition or in lieu of controlling the frequency and scanning path, may also control the intensity and frequency of the T-rays. In a manner similar to that described above, the image signals generated by the T-rays are computer-processed, and control signals are generated for controlling the CVD process.

In one form, code signals generated from the results of a first computer analysis of the modulated T-rays are employed by the computer to vary the frequency(s) of the radiation first employed in the test to provide additional modulated T-rays at a different frequency or frequencies, directed at the same matter, to allow further analysis. Fuzzy logic and/or neural network electronics, as well as software and expert computer systems, may be employed to complete a test or analysis of matter using such T-rays.

Alternatively, a number of optical and/or radiation systems can simultaneously be employed, including T-rays, x-rays, MRI, CAT, PET, TV, spectral (fluorescence, etc.), ultrasonic radiation, etc., and the resulting image signals can be computer-processed so that control signals can be generated for controlling the CVD process. Scanning the substrate or blank or deposited layers using any one or a combination of these systems can be done both parallel to or normal to the plane of deposition. Simultaneously in real time, the scanning signals can be computer-analyzed and control signals generated for controlling the CVD process. If multiple optical and/or radiation systems are employed, they may be used to scan in one direction or in multiple directions (normal and parallel to the deposition plane) and/or multiple systems can be associated with each of the different directions. Also, the computer analysis of the scanning signals can be used not only to control the depth of the layer(s) deposited but also the distribution across a substrate surface (s) of different deposited materials.

In still another alternative embodiment, a mask(s) can be positioned over the substrate, allowing a more refined distribution of deposition of a material(s) across the substrate surface. Prior to placement of the mask(s) over the substrate, a graphical representation of the topography of the mask(s) can be input into the computer. Following scanning of the substrate using any one or a combination of any of the systems and techniques described above, the computer can be used to interrelate the results of the scanning with the necessary deposition controls for the mask(s), given the predetermined image of the coating desired already resident within the computer.

The substrate can also be scanned (from the side and/or normal thereto) with a laser beam(s) (or other beams capable of machining, vaporizing or ablating matter) whose positioning is computer-controlled. The programmable computer derives real-time feedback signals from this scanning by the laser (or other devices such as an electronic gun, E-beam machining system, etc.) to precisely control laser positioning. These techniques are again used to provide controlled deposition of a layer onto a substrate. Microelectronic circuits or "micromachines" can thus be formed, through a combination of computer-controlled CVD deposition and computer-controlled surface ablation, using the techniques described here and above.

DETAILED DESCRIPTION OF THE PREFERRED EMBODIMENTS—EBPVD

Figure 5:
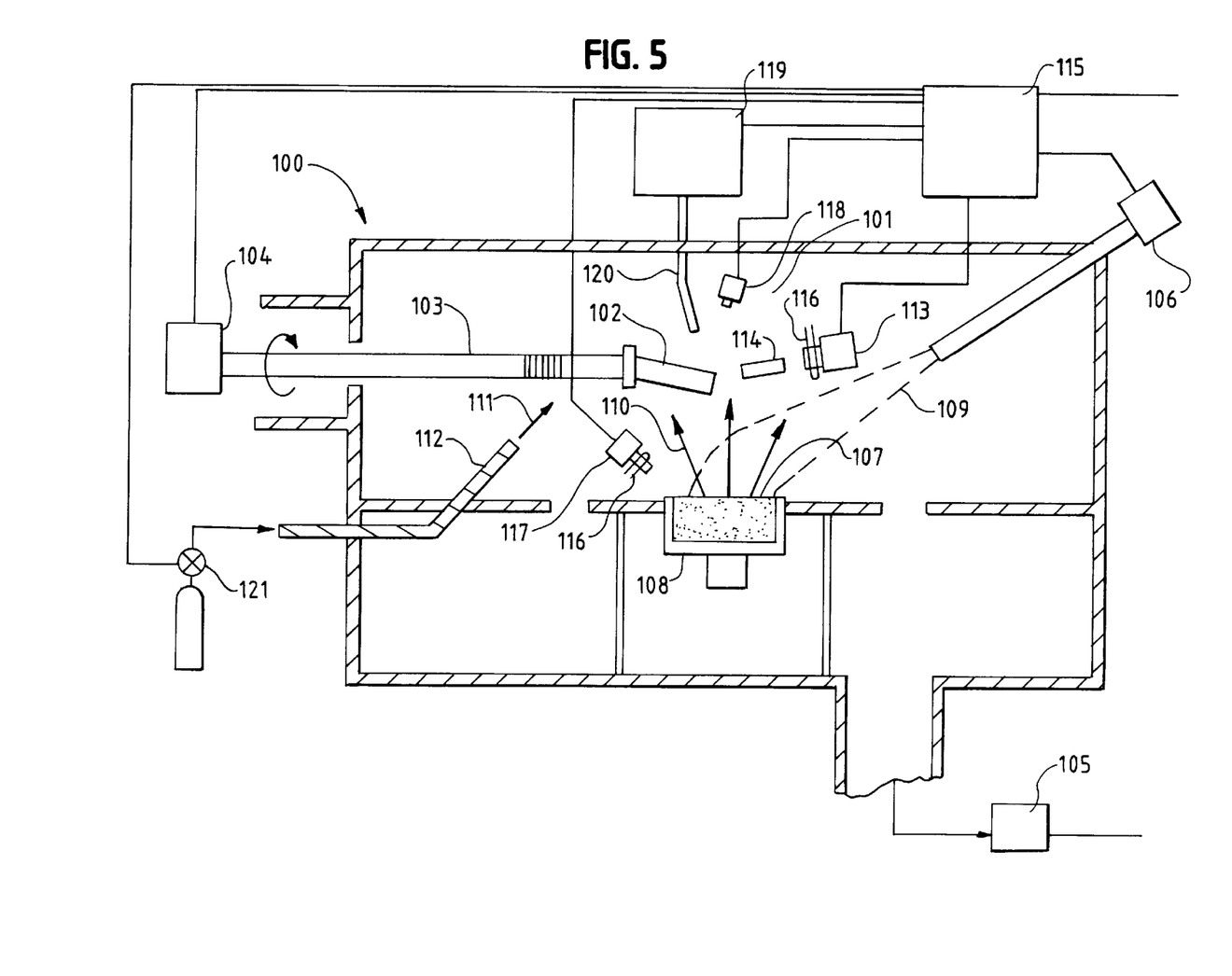
FIG. 5 shows an EBPVD apparatus to which the control system of one embodiment of this invention has been applied.

FIG. 5 shows an EBPVD coater to which my invention has been applied. In an EBPVD operation, coatings of ceramic materials based on zirconia, magnesia and ceria (for example, Yttria- or magnesia-stabilized zirconia) are applied to various base alloys. Other useful ceramic coatings which may be applied by EBPVD techniques include $Al_2O_3$—MgO; TiN—$SI_3N_4$ and SiC. The ceramic coatings may have columnar structures, as described in U.S. Pat. No. 4,405,660 (Ulion, et al.), U.S. Pat. No. 4,321,311 (Strangman), U.S. Pat. No. 4,405,659 (Strangman) and Re. 33,876 (Goward, et al.), the disclosures of which are incorporated by reference herein. A metallic bond layer comprising an alloy of a metal such as iron, cobalt or nickel with Cr, Al and Y may be used to improve adhesion of the ceramic to the substrate, as described in U.S. Pat. No. 5,015,502 (Strangman, et al.).

Referring now to FIG. 5, an EBPVD coater included in my invention is shown generally as 100. The coater includes a deposition chamber 101, into which a part or substrate 102 which is to be coated has been introduced. The part or substrate 102 may be mounted on holder 103, which if desired can be rotated by motor 104 in order to improve the uniformity of the coating. Reaction chamber 101 is held under vacuum by means of vacuum pump 104 [no—105?]. A hard vacuum is required for satisfactory performance of the electron beam gun 106.

During the coating operation, an ingot 107 of the ceramic material to be deposited is placed in holder 108. A stream of electrons 109 from electron beam gun 106 is focused on the ingot 107, causing it to liquefy, vaporize and diffuse toward the part or substrate 102, in the general directions shown by arrows 110. Upon contact with the comparatively cold part or substrate 102, the vapor condenses to form a coating. Ceramic pellets or powder can be used in place of an ingot. It is possible to feed an elongated ingot upward into the focus of the electron beam during operation of the coater, thereby allowing longer coating times without need to repressurize the reaction chamber and replace the ingot.

Among the critical properties of the coating are its stoichiometry. Vaporization of the ceramic material can lead to some cleavage of ceramic-oxygen bonds, which can result in deposition of non-stoichiometric coating that is deficient in oxygen. Thus, a stream of oxygen 111 is sometimes injected into the reaction chamber in the vicinity of the part or substrate being coated through a manifold or nozzle 112. Oxygen flowrate may be controlled by valve 121 which in turn is adjusted by computer 115, as described below.

To avoid interfering with the operation of the electron beam, when oxygen or other reactant gas is added it may be desirable to place a shroud (not shown) around the vicinity of the part or substrate being coated to confine the oxygen-enriched zone to that reduced volume. Too much gas, or too high a pressure, in the path of the electron beam can contribute to instability of the beam and cause uneven vaporization of the refractory ingot. As noted in U.S. Pat. No. 5,418,003 (Bruce, et al.), workers in this area have noted that electron beam focusing problems can lead to irregular vaporization of the ceramic ingot, causing splluttering or spitting of gas from the pool of liquid onto the ingot surface. Uneven evolution of gas causes pressure and composition fluctuation near the part or substrate being coated, and further disrupts the focus of the electron beam.

Recognizing these problems, it is suggested to place a shroud (not shown) around the path of the electron beam and to provide supplementary vacuum pumping of the volume within the shroud in order to provide a harder vacuum along the path of the beam until just adjacent the ingot to be vaporized.

In addition to being dependent upon stoichiometry and ambient pressure and gas composition, coating quality also is sensitive to the rotational speed of the part or substrate; the temperature of the part or substrate; the rates of vaporization and deposition; the orientation of the ingot in relation to the part or substrate, and other factors.

Referring again to FIG. 5, there is provided a novel solution to the problems of electron beam focus stability and atmosphere control. One or more optical sensors 113 are provided; they are focused either on the part or substrate 102 that is being coated or on a test blank 114 that is positioned near the part or substrate being coated and exposed to substantially identical conditions. If the part or substrate 102 is being revolved during the coating operation, the optical sensor(s) 113 may be adjusted to revolve along with the part or substrate and thus maintain focus during operation. Alternatively, a test blank 114 may be used and it may be maintained stationary during operation even if the part or substrate 102 rotates. Optical sensor(s) 113 may be fitted with heating devices 116 to maintain their lenses at temperatures above the temperatures at which condensation of the ceramic vapor occurs. Alternatively, a gas purge system using oxygen or inert gas may be used to keep the lenses clear of condensing coating material.

The optical sensor(s) 113 are used to sense an image of the part or substrate 102 or the test blank 114. The thickness and/or the surface texture is thereby predetermined. Optical sensor(s) 113 communicate with computer 115. As with CVD processes, the optical sensor(s) may include TV cameras and/or other visible, infrared and/or laser light based devices or other radiation-based imaging systems such as x-ray imaging systems or MRI systems.

In addition to optical sensor(s) 113 focused on the part or substrate 102 or on a blank 114, one or more optical sensors may be focused on the surface of ingot 107. These sensors, too, may include TV cameras and/or other visible, infrared and/or laser light based or other radiation-based imaging systems such as x-ray imaging systems or MRI systems. These sensors are used to sense an image of the pool of boiling, molten refractory material on the surface of the ingot and to communicate the image to computer 115. Heating devices 116 also may be used on sensors 117. Further, the automatic, computer-controlled measurement equipment may include one or more pyrometers 118, which are used to measure the surface temperature of the part or substrate 102 and/or the blank 114 and/or the surface of ingot 107. In addition, gas analyzer 119 may be used to obtain a sample of the gaseous atmosphere in the vicinity of the part or substrate 102 via sampling tube 120. Primary variables measured typically would be ambient pressure, oxygen content of gas and possibly the vapor pressure of vaporized refractory material.

Computer 115 is used to process and analyze image signals from optical sensors 113 and 117, as well as data on gas composition, part or substrate temperature, ingot temperature, rotational speed and other process variables.

During coater operation, the computer is used as follows to optimize coating properties. A predetermined mathematical model of the coating process which takes account of the effect of pertinent process variables on a selected group of coating properties is used as a basis for calculations. The process variables may include oxygen flowrate, part or substrate temperature, ingot temperature, gas composition, electron beam power input, part or substrate rotational speed and the like. A predetermined mathematical model is used to relate the predicted effects of changes in those process parameters on one or more objective functions. The objective functions may include average coating thickness; von Mises stress; coating surface finish and patterns of coating deposition or non-deposition, among other possibilities. In addition, the image(s) of the ingot surface may be evaluated to identify areas of uneven melting or boiling; that information can then be used to adjust the focus and/or intensity of the electron beam to automatically provide even vaporization of the refractory.

Suitable mathematical models can be written from models of the mass transfer involved in the coating deposition process combined with radiation/convection/conduction heat transfer equations and enthalpy balances to predict temperatures and deposition rates at the part or substrate surface. Alternatively or additionally, a multivariable linearized mathematical model may be created by establishing steady state operation near a set of conditions thought to be moderately suitable, and then perturbing the controlled variables (temperatures, oxygen flowrates, etc.) one at a time by a small amount away from the initial condition while measuring the effect on the controlled variables used as inputs for the objective function (coating thickness, refractory vaporization rate, growth rate, etc.). The resulting plurality of transfer functions can be used in a linearized model to predict behavior in a region near the initial steady state operating conditions. Again, while such a model lacks the theoretical underpinnings of a model based on heat and mass transfer, but may be superior in terms of accounting for unpredictable artifacts of particular reactor setups. The usable ranges of stochastic models of the latter sort can be broadened by utilizing non-linear transfer functions, where appropriate. (For example, Ficks Law rate expressions with statistically determined coefficients advantageously can be used to model temperature effects on mass transfer rates.)

However the mathematical model is created, it is used as follows. During process operation, the output of the optical or other sensing devices 113 and 117 is preferably digitized and then compared with a predetermined image of the coating desired, generating an error signal representing the deviation of the actual coating thickness or shape from the desired thickness or shape. One or more time-averaging techniques based on successive images obtained over time may be employed to yield coating growth rates as well. The resulting error signal is utilized, together with measurements of other process parameters (temperatures, reactant flowrates and the like) as inputs to the mathematical model of the coating process. Numerical values of one or more objective functions are then calculated. Next, one or more of a variety of optimization algorithms known to those skilled in the art is used by the computer to predict values of the objective function(s) that would result from step changes by predetermined amounts in the controlled variables. The computer model then selects the best of the group of predicted outcomes from among the series of changes surveyed ("best" in the sense of, e.g., minimizing or maximizing one or more objective functions chosen beforehand based on the goal of the operation). The control points for the controlled variables are then adjusted to reflect the values predicted for the best outcome, and the process of measurement, prediction and correction is repeated. This adaptive control process continues until the predetermined coating specifications have been met, or until the mathematical model indicates that further improvement in the objective function is not possible.

By utilizing computerized process control, it will be possible to optimize coating properties while avoiding the electron beam stability problems and difficulties with non-stoichiometric coatings that have been encountered with prior art processes.

Those of ordinary skill in the art will recognize from the foregoing that the present invention is not limited to vapor deposition techniques, but can also be used to advantage where ablation, shaving, polishing, finishing, topographical "mapping" or selective removal of material from an object (collectively referred to here as "contouring") is required. For example, it will be understood that coatings on existing substrates, or the substrates themselves, can be selectively shaped or contoured in a predetermined manner using the techniques of the present invention. To take a specific example, the semiconductor industry currently requires that the surface of semiconductor wafers be planarized to a flat or nearly flat condition, since the elimination of nonplanar features has been found to extend the life of existing lithography capabilities. The scanning techniques using the optical and/or radiation systems disclosed above (e.g., TV, T-rays, MRI, PET, etc.) can be performed on the surface of the semiconductor wafer, with the resulting imaging signals being processed by a programmable computer with a memory, and control signals being generated to vary any of various parameters of (e.g.) a laser beam (e.g., frequency, positioning, etc.). This will permit the selective control over the contouring of the surface of the object to (in this example) achieve a planar wafer surface.

It will be apparent to those of ordinary skill in the art that many changes and modifications could be made while remaining within the scope of my invention. I intend to cover all such equivalent processing methods, and to limit my invention only as specifically delineated in the following claims.

I claim:

1. A method for controlling a vapor deposition process comprising:
    a. providing a substrate to be coated;
    b. exposing said substrate to a gas atmosphere;
    c. depositing a coating from said gas atmosphere onto said substrate in an ongoing coating process;
    d. providing at least one imaging sensor operatively situated to provide an image of said substrate;
    e. scanning said substrate during said coating process, and using said imaging sensor to produce images of said coating;
    f. providing a programmable computer having a memory;
    g. processing said image signals using said computer and comparing the image signals to those of a predetermined computer model of said coating process resident within the memory of said computer, to thereby generate one or more objective functions related to the quality of said coating;
    h. numerically applying to said one or more objective functions a feedback optimization algorithm to yield control points for said coating process;
    i. modifying at least one of said control points based on the results obtained from said optimization algorithm;
    j. providing a laser interferometer or an infrared ellipsometer to measure thickness of said coating, in addition to said imaging sensor; and
    k. switching to thickness measurements from said laser interferometer or said infrared ellipsometer as an input to said computer model when said coating thickness approaches a predetermined, desired value.

2. The method of claim 1 wherein said image signals are reconstructed and define images of slices of a profile of said coating, using a polygonal curve approximation technique.

3. The method of claim 2 wherein said image signals are further processed using triangulation algorithms to construct a wireframe approximation of the substrate and coating.

4. The method of claim 3 wherein said wireframe approximation is compared with a predetermined model of a desired manufactured part.

5. The method of claim 2, wherein at least two of said slices of a profile of said coating correspond to different materials, and parameters describing physical behavior for said materials reside within said computer memory.

6. The method of claim 1 wherein said imaging sensor scans the entire thickness of said coating at a fixed rate and said thickness is calculated from the scanning frequency.

7. The method of claim 1 wherein said imaging sensor uses fluorescent light to determine thickness of the coating.

8. The method of claim 1 wherein said coating process is a chemical vapor deposition process, and said control points include at least one of the reactant gas flowrates, reactor pressure, reactor and substrate temperature profiles and heat input rates.

9. The method of claim 8, further comprising controlling flow of a purge gas operatively adapted to maintain said imaging sensor free of deposited coating.

10. The method of claim 9 wherein said purge gas comprises a cold reactant gas.

11. The method of claim 1 wherein said coating process is an electron beam physical vapor deposition process, and said control points include at least one of the oxygen flowrate, reactor pressure, substrate temperature, ingot temperature, electron beam focus, electron beam intensity and substrate rotational speed.

12. The method of claim 11, further comprising providing a heating device operatively adapted to maintain said imaging sensor substantially free of deposited coating.

13. The method of claim 1, comprising the steps of:
    j. providing a laser interferometer to measure coating thickness, in addition to employing said imaging sensor for measurement; and
    k. switching to thickness measurements from said laser interferometer as an input to said computer model when said coating thickness approaches a predetermined, desired value.

14. The method of claim 13, wherein the rate of said coating process is reduced when said thickness measurements are switched and are provided as an input to said computer model by said laser interferometer.

15. The method of claim 1, comprising the steps of:

j. providing an infrared ellipsometer to measure coating thickness, in addition to said imaging sensor; and k. switching to thickness measurements from said infrared ellipsometer as an input to said computer model when said coating thickness approaches a predetermined, desired value.

16. The method of claim 15, wherein the rate of said coating process is reduced when said thickness measurements are switched and are provided as an input to said computer model by said infrared ellipsometer.

17. The method of claim 1, wherein said substrate is located within a reaction chamber, and continuously-cleaned fiber optics located within said reaction chamber are used to convey a visible light image of the substrate to a remotely-located TV sensor.

18. The method of claim 1, wherein said scanning of said substrate coating is accomplished using one or any combination of the following forms of energy: x-rays, T-rays, radio waves, infrared radiation, ultrasonic radiation or laser energy.

19. The method of claim 1, wherein said scanning of said substrate coating is accomplished using one or any combination of the following techniques or devices: magnetic resonance imaging, PET, CAT, spectrometry, fiber optics, or television cameras.

20. The method of claim 1, further comprising the step of generating three dimensional slices of a profile of said coating that visually indicate changes in material composition.

21. The method of claim 1, wherein said coating is a ceramic and a metallic bond layer is applied to said substrate to improve adhesion of said ceramic to said substrate.

22. The method of claim 1, wherein said substrate is in revolving movement during said coating process, and said imaging sensor is operatively adjustable to said revolving movement, thereby enabling said imaging sensor to maintain focus of said substrate during said coating operation.

23. The method of claim 1, wherein said imaging sensor is used to determine the thickness or the surface texture of said substrate.

24. The method of claim 1, further comprising the step of generating a multivariable linearized mathematical model by establishing steady state operation of said coating process based on a predetermined set of conditions, and then perturbing the controlled variables to facilitate the prediction of behavior in a region near said steady state operation.

25. The method of claim 24, further comprising the step of using said computer model and said optimization algorithm to adaptively control said coating process by continuously changing, in predetermined increments, said controlled variables to thereby maximize the chances for reaching said one or more objective functions, said adaptive control continuing until a set of predetermined coating specifications have been reached, or further improvement in said objective functions is not possible.

26. A method for controlling a vapor deposition process comprising:

a. providing a substrate to be coated;

b. exposing said substrate to a gas atmosphere;

c. depositing a coating from said gas atmosphere onto said substrate during an ongoing coating process;

d. providing a test blank exposed to said gas atmosphere under substantially the same conditions as said substrate, thereby depositing said coating on said test blank;

e. providing at least one imaging sensor operatively situated to provide image signals of said test blank;

f. scanning said test blank using said imaging sensor to produce image signals of said coating during the coating process;

g. providing a programmable computer having a memory;

h. processing said image signals using said computer and comparing the image signals to those of a predetermined computer model of said coating process resident within said computer memory to generate one or more objective functions related to the quality of said coating;

i. numerically applying to said one or more objective functions a feedback optimization algorithm to yield control points for said coating process, said optimization algorithm being designed to maximize the quality of said coating;

j. modifying at least one of said control points based on the results obtained from said optimization algorithm;

k. providing a laser interferometer or an infrared ellipsometer to measure thickness of said coating, in addition to said imaging sensor; and l. switching to thickness measurements from said laser interferometer or said infrared ellipsometer as an input to said computer model when said coating thickness approaches a predetermined, desired value.

27. The method of claim 26 wherein said image sensor scans the entire thickness of said coating at a fixed rate and said thickness is calculated from the scanning frequency.

28. The method of claim 26 wherein said image sensor uses fluorescent light to determine thickness of said coating.

29. The method of claim 26 wherein said image signals are employed to reconstruct image information as slices of a profile of said coating, using a polygonal curve approximation technique.

30. The method of claim 29 wherein said image signals are further processed using triangulation algorithms to construct a wireframe approximation of the substrate and coating.

31. The method of claim 30 wherein said wireframe approximation is compared with a predetermined model of a desired manufactured part.

32. The method of claim 26 wherein said coating process is a chemical vapor deposition process, and said control points include at least one of the reactant gas flowrates, reactor pressure, reactor and substrate temperature profiles and heat input rates.

33. The method of claim 32, further comprising a purge gas associated with said imaging sensor and operatively adapted to maintain said imaging sensor free of deposited coating.

34. The method of claim 33 wherein said purge gas comprises cold reactant gas.

35. The method of claim 26 wherein said coating process is an electron beam physical vapor deposition process, and said control points include at least one of the oxygen flowrate, reactor pressure, substrate temperature, ingot temperature, electron beam focus, electron beam intensity and substrate rotational speed.

36. The method of claim 35, further comprising a heating device associated with said imaging sensor and operatively adapted to maintain said imaging sensor free of deposited coating.

37. The method of claim 26, comprising the steps of:

k. providing a laser interferometer to measure coating thickness, in addition to said imaging sensor; and l. switching to thickness measurements from said laser interferometer as an input to said computer model when said coating thickness approaches a predetermined, desired value.

38. The method of claim 26, comprising the steps of:

k. providing an infrared ellipsometer to measure coating thickness, in addition to said imaging sensor; and l. switching to thickness measurements from said infrared ellipsometer as an input to said computer model when said coating thickness approaches a predetermined, desired value.

39. The method of claim 26, wherein said substrate is in motion during said coating process, and said test blank remains stationary.

40. The method of claim 26, wherein said imaging sensor is used to determine the thickness or the surface texture of said test blank.

* * * * *